United States Patent [19]

Soclof et al.

[11] 4,369,406

[45] Jan. 18, 1983

[54] SEMICONDUCTOR MAGNETO-TRANSISTOR DEVICE

[75] Inventors: Sidney I. Soclof, San Gabriel; Michael T. Elliott, Carbon Canyon, both of Calif.

[73] Assignee: Rockwell International Corporation, El Segundo, Calif.

[21] Appl. No.: 146,928

[22] Filed: May 5, 1980

[51] Int. Cl.³ .................. G01R 33/02; H01L 27/22; H01L 43/00
[52] U.S. Cl. .................................. 324/252; 357/27; 307/309
[58] Field of Search ............... 324/228, 235, 251, 252; 357/27; 307/309; 365/7-9; 360/112

[56] References Cited

U.S. PATENT DOCUMENTS 3,585,462  6/1971  Lehovec .......................... 357/27

OTHER PUBLICATIONS

Chaudhari et al., "Integration of Magnetic Bubble Domain Devices with Semiconductor Sensing Devices", Apr. 1973, IBM Tech. Disc. Bul., vol. 15, No. 11, pp. 3336-3337.

Primary Examiner—Gerard R. Strecker
Assistant Examiner—Walter E. Snow
Attorney, Agent, or Firm—H. Fredrick Hamann; Daniel R. McGlynn

[57] ABSTRACT

A device for reading information representing magnetization patterns on a medium by means of a time-of-flight magnetotransistor detector. The time-of-flight magnetotransistor detector consists of a bipolar transistor implemented on a semiconductor surface which is in a magnetic flux coupling with a plurality of magnetization patterns. Such magnetization patterns which may be generated by a magnetic bubble domain on an adjacent bubble domain device or by a magnetized region on an adjacent media such as a magnetic tape or disk. The magnetotransistor detector consists of an emitter region, an elongated base region, and a collector region, and a twin-lead thin-film transmission line in capacitive coupling with the base region of the magnetotransistor. The presence of a magnetic field in the base region creates a Hall voltage which produces a pulse on the transmission line.

9 Claims, 4 Drawing Figures

SEMICONDUCTOR MAGNETO-TRANSISTOR DEVICE

FIELD OF THE INVENTION

The invention is concerned with a detector for reading information representing magnetization patterns at a predetermined location and more particularly with a time-of-flight detector for reading such magnetization patterns.

BACKGROUND OF THE INVENTION

The invention relates to devices for reading information representing magnetization patterns and more particularly to a time-of-flight magneto-detector for reading such patterns.

Various types of detectors for reading information representing magnetization patterns are known in the prior art. These include various magnetoresistive elements as well as devices which operate by means of the Hall effect. The Hall effect is concerned with the deflection of charged particles under the influence of an external magnetic field, producing a voltage traverse to the direction of current flow. The general disadvantage of these prior art devices are that they are limited by the speed at which they operate.

SUMMARY OF THE INVENTION

Briefly and in general terms, the invention is concerned with a time-of-flight detector for reading information representing magnetization patterns at predetermined information positions.

More particularly, the invention includes a body of semiconductor material provided with a plurality of detector elements adjacent a major surface thereof. Each of the detector elements is disclosed adjacent a corresponding respective one of the information positions. Each detector element is formed by a first surface zone of a first conductivity type and a first dopant concentration, second and third surface zones spaced apart from said first surface zone and from each other, the second and third surface zones being of the first conductivity type and the first dopant concentration, and a fourth surface zone of a second conductivity type and a second dopant concentration. The fourth surface zone is disposed between the first surface zone and the second surface zone, and between the first surface zone and the third surface zone.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE PREFERRED EMBODIMENT

Figure 1:
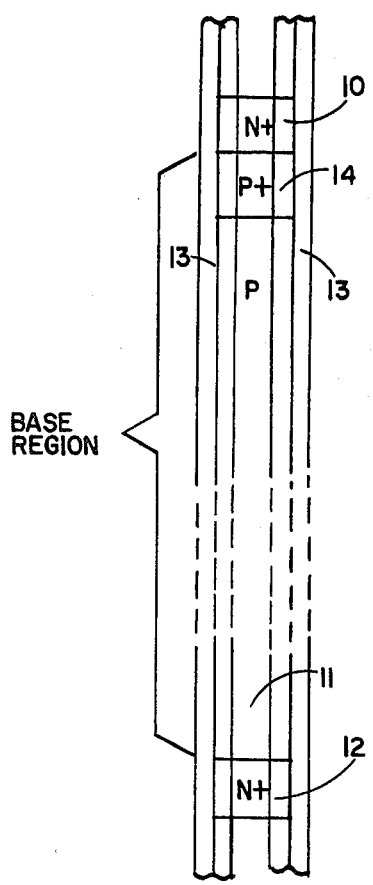
FIG. 1 is a highly simplified top plan view of the time-of-flight magneto-detector according to the present invention.

Referring to FIG. 1, there is shown a top plan view of the time-of-flight magneto-detector according to the present invention. In the preferred embodiment, the detector utilizes a magnetotransistor detector implemented as an elongated, lateral, dielectrically isolated bipolar transistor on the surface of a semiconductor body, such as a semiconductor strip. The bipolar transistor consists of an emitter region 10, a base region 11, and a collector region 12.

The emitter region 10 is a first surface zone of a first conductivity type and a first dopant concentration. In the embodiment shown in FIG. 1, it is n+. The collector region 12 is a second surface zone also of the first conductivity type and the first dopant concentration, (i.e. n+, type). The base region 11 forms a third surface zone of a second conductivity type and a second dopant concentration (i.e. p-type) and is disposed between the first and the second surface zones.

The emitter region 10 and the collector region 12 are preferably rectangularly shaped regions, while the base region 11 is preferably an elongated region extending between the first region and the second regions. Adjacent to each side of the elongated region 11, and extending past the emitter and collector regions 10 and 12 are two thin film "transmission lines" 13 whose function will be subsequently described.

The portion of the surface region 11 directly adjacent the emitter region 10 has a higher dopant concentration than the remainder of the region 11. This region of higher dopant concentration, that is forming a p+-type region, is shown in the FIG. 1 as forming a region 14.

Figure 2:
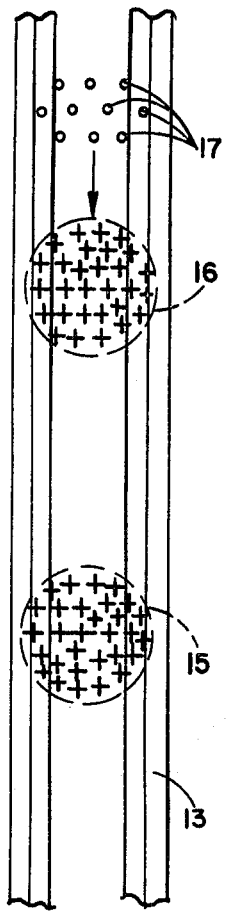
FIG. 2 is a plan view similar to that in FIG. 1 showing the movement of a bubble and an electron packet in the detector.

In order to indicate how the magnetotransistor detector interfaces with an adjacent magnetic media, and in particular, with an adjacent information carrying magnetization element in close proximity to the magnetotransistor detector, reference should be made to FIG. 2 in which there is suggested the position of a track or propagation path for magnetic bubble domains on a layer of magnetic material which is placed in a plane substantially parallel to and adjacent the surface of the semiconductor body upon which the time-of-flight magnetotransistor detector is implemented. The dotted circles 15 and 16 show the position of magnetic bubble domains in the magnetic layer in relationship to the elements of the magnetotransistor detector in FIG. 1. The dotted lines 15 and 16 also show the size and position of the magnetic bubble as overlying a portion of the base region 11. In order to understand the operation of the device one must consider the flow of electrons 17 from the emitter to the collector in the presence of a magnetic field normal to the surface of the magnetotransistor detector, such as generated by the presence of a magnetic bubble 15 or 16.

Figure 3:
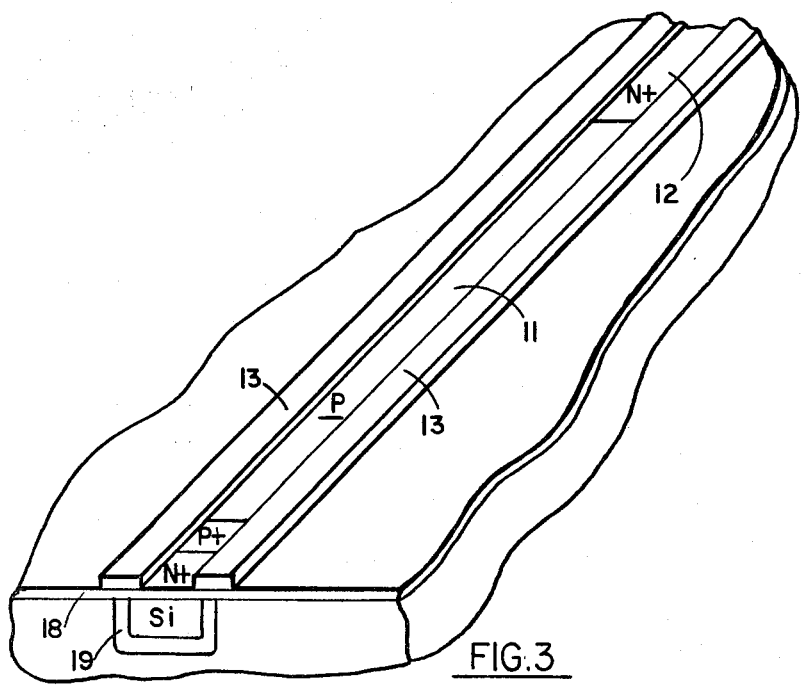
FIG. 3 is a cross-sectional perspective view of the time-of-flight magneto-detector through the 3—3 plane in FIG. 1.

Turning now to FIG. 3 there is shown a cross-sectional perspective view of the magnetotransistor detector through the 3—3 plane shown in FIG. 1. In the figures like elements have the same reference numerals so that the emitter region 10, the base region 11, the collector region 12, and the p+ region 14 is shown in the figure in perspective corresponding to the view shown in FIG. 1. A magnetic media such as a magnetic tape or a thin layer of magnetic material (not shown)

which supports bubble domains is shown which is arranged substantially parallel to the surface of the semiconductor body on which the magnetotransistor detector according to the present invention is implemented. In the particular example shown in FIG. 2, the magnetic layer is a layer which supports magnetic bubble domains such as the bubble domain 15 and 16. The bubble domain 17 has associated with it a magnetic field B which is shown having a field shown by the "X" markings, i.e. perpendicular to the semiconductor body surface. The magnetic layer is separated from the semiconductor surface by a relatively thin air gap.

Figure 4:
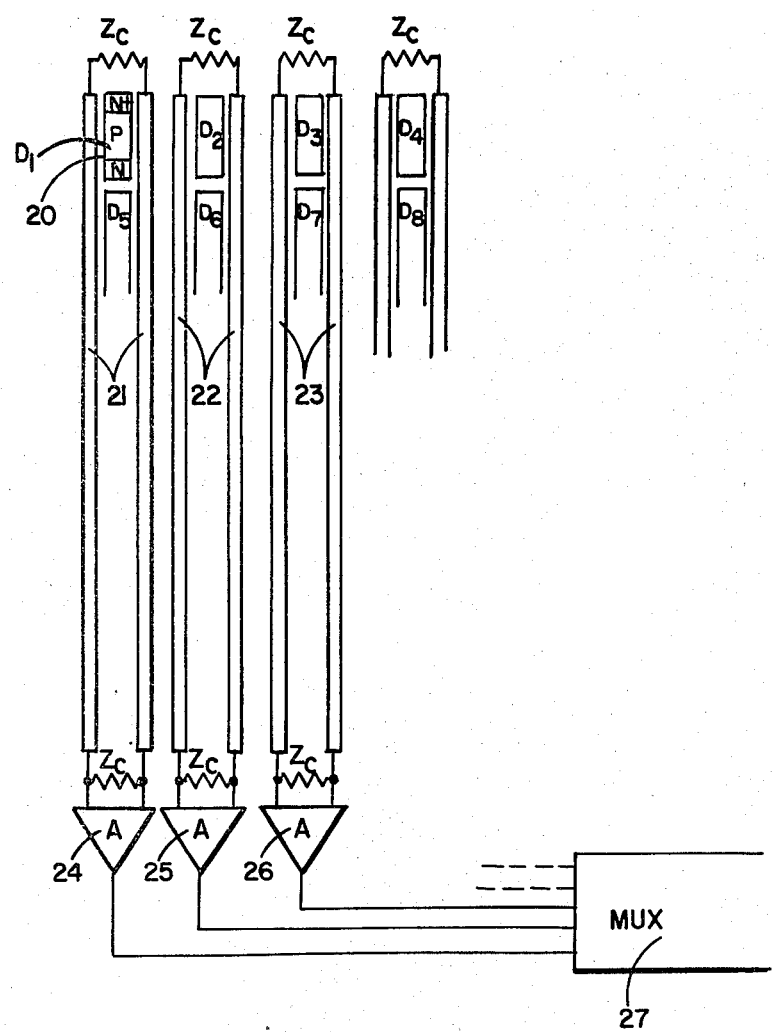
FIG. 4 is a schematic diagram symbol of an implementation of the detector according to the present invention.

FIG. 4 is a top plan view of a plurality of time-of-flight magnetotransistor detectors 20 according to the present invention and labelled $D_1, D_2, \ldots D_n$ which are formed on the surface of the semiconductor body 21. Adjacent and parallel to the semiconductor body is a layer of magnetic material (not shown) which incorporates a plurality of tracks or information positions $T_1, T_2 \ldots T_n$. Each of these information positions has associated with it an information-containing magnetic field. Each of the tracks $T_1, T_2, \ldots$ is associated with a respective one of the magnetotransistor detectors $D_1, D_2, \ldots$. Thus the arrangement as shown in FIG. 4 shows a plurality of magnetotransistor detectors can be used to simultaneously readout a multi-track magnetic media.

As pointed out above, the device is in the form of a lateral, dielectrically isolated, NPN transistor with a very long base drift region as shown in FIG. 1. Adjoining the base region on either side, and separated from the base region by a thin oxide layer, is a "twinlead" thin film transmission line.

The bubble chip is placed in close proximity to the silicon chip containing the magnetotransistor detectors, such that the magnetic field of the bubble passes into the base region as shown in FIG. 2. The emitter-base junction voltage of the device is pulsed such that a short "packet" 17 of electrons is injected into the base region. As this packet of electrons drifts through the base region towards the collector, it will come under the influence of the magnetic field of the bubbles. This will produce a transverse deflection of the electron packet. This will in turn cause a slight shift in the electron distribution resulting in a transverse voltage (i.e., the Hall effect). The Hall voltage so created is in the form of a pulse waveform and will be coupled to the adjoining transmission line via capacitative coupling. The capacitative coupling of the pulse waveform will result in a voltage pulse on the transmission line. The pulse on the transmission line will propagate down the line to an amplifier 24, 25, or 26 at the end of the line as shown in FIG. 4. The output of this amplifier will be a series of pulses which will be a time-domain representation of the spatial distribution of the magnetic bubble distribution along the length of the line. It should be noted in FIG. 4 that the transmission line is preferably terminated at both extreme ends by resistances of value equal to the characteristic impedance of the line to prevent reflections.

FIG. 4 also shows a sequence of parallel transmission lines 21, 22, etc., each with magnetotransistor detectors 20 of the type shown in FIGS. 1-3 which can be used to provide an X-Y read-out of the magnetic bubble pattern. The amplifiers 24, 25, and 26 are connected to a multiplexer 27, and further circuitry (not shown) for decoding the information provided from the signals on the transmission lines.

In the preferred embodiment according to the present invention, the magnetotransistor detector is implemented as a bipolar transistor having an essentially elongated geometric configuration. It must be realized however that the present invention is not limited to the geometric configuration shown in the preferred embodiment or the electronic structures associated with bipolar transistors. Since other geometric configurations and structures, as well as other transistor devices, including field effect transistors, integrated injection logic devices, thyristors, and other structures could be implemented as well.

The semiconductor body shown in FIG. 1 upon which the magneto-transistor detector is implemented may take a wide variety of different forms. One possibility is for the semiconductor material to be placed on a flexible strip and the flexible strip applied to either the outer or inner surface of a cylindrical body.

It will be obvious to those skilled in the art that the magnetotransistor detector according to the present invention can be manufactured with various semiconductor technologies and different combinations of known process steps, and that the preferred embodiments illustrated here are merely exemplary. The depth of penetration of the various zones and regions and in particular the configuration and distance between the active zones of the detector, as well as the concentrations of dopant species, and/or their concentration profiles, can be chosen depending upon the application or desired detection capability. These and other variations can be further elaborated by those skilled in the art without departing from the scope of the present invention.

The present invention is also not restricted to the specific semiconductor materials and circuits described. For example, it may be pointed out that semiconductor materials other than silicon, for example $A_{III}$-$B_V$ compounds, may be used. Furthermore, the conductivity types in the semiconductor regions may be interchanged and corresponding to such change, the polarity of the respective operating voltages adapted. Moreover, the voltage level and the static or dynamic nature of the signals applied to the various terminals and gates of the device, as well as the voltage sources, may be suitably selected as desired for a particular application.

Without further analysis, the foregoing will so fully reveal the gist of the present invention, that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A semiconductor magnetic detector for reading information representing magnetization position at a plurality of separate information positions, comprising:

a body of semiconductor material including a surface emitter zone of first conductivity type, an elongated base surface zone of a second conductivity type disposed in said body adjacent said emitter zone, and a collector surface zone of first conductivity type disposed adjacent said base zone, a main current path of charge carriers being formed through said base zone from said emitter zone to said collector zone, said base zone being situated with respect to said information positions such that the presence of a magnetic field at said information positions will deflect drifting charge carriers;

a pair of thin film conductors disposed on said body on respective opposed sides of the width of said elongated base surface zone and in capacitative coupling therewith and functioning to detect a Hall voltage across the width of said base surface zone resulting from a shift in electron distribution in said base zone due to the presence of a magnetic field in an information position deflecting said charge carriers in said base zone.

2. A detector as defined in claim 1, wherein the information positions are positions on a magnetic storage media containing a region of magnetization in a predetermined direction.

3. A detector as defined in claim 1, further comprising a surface zone of second conductivity type and a dopant concentration greater than that of said base surface zone disposed between said emitter surface zone and said base surface zone.

4. A detector as defined in claim 1, wherein said elongated base surface zone is substantially rectangular shaped.

5. A semiconductor magnetic detector for reading information-representing magnetization positions at a plurality of separate information positions, comprising:
a body of semiconductor material including an elongated semiconductor channel;
means disposed at one end of said channel for injection of charge carriers therein;
a collector surface zone at the other end of said channel;
said channel being situated with respect to said information positions such that the presence of a magnetic field at said information position will deflect drifting charge carriers in said channel; and
detection means disposed on said body on respective opposed sides of said channel, said detection means functioning to detect a Hall voltage across the width of said channel resulting from a shift in electron distribution due to the presence of a magnetic field in said information position deflecting said charge carriers in said channel.

6. A magnetic detector as defined in claim 5, further comprising a bipolar transistor in said body of semiconductor material, said bipolar transistor including a surface emitter zone, a surface base zone, and a surface collector zone.

7. A magnetic detector as defined in claim 6, wherein said channel comprises the base zone of a bipolar transistor.

8. A magnetic detector as defined in claim 6, wherein said means for injecting charge carriers comprises an emitter zone of said bipolar transistor.

9. A magnetic detector as defined in claim 6, wherein said collector surface zone comprises a collector zone of said bipolar transistor.

* * * * *